(12) United States Patent
Athavale et al.

(10) Patent No.: US 6,261,967 B1
(45) Date of Patent: Jul. 17, 2001

(54) EASY TO REMOVE HARD MASK LAYER FOR SEMICONDUCTOR DEVICE FABRICATION

(75) Inventors: Satish D. Athavale, Fishkill, NY (US); Hua Shen, Sunnyvale, CA (US); David Kotecki, Orono, ME (US); Jenny Lian, Wallkill, NY (US)

(73) Assignees: Infineon Technologies North America Corp., Cupertino, CA (US); International Business Machine Corporation, Armonk, NY (US)

( * ) Notice: Subject to any disclaimer, the term of this patent is extended or adjusted under 35 U.S.C. 154(b) by 0 days.

(21) Appl. No.: 09/501,479

(22) Filed: Feb. 9, 2000

(51) Int. Cl.[7] .................................................. H01L 21/302
(52) U.S. Cl. .................. 438/717; 438/705; 438/725; 438/715; 438/714; 438/686; 438/671; 438/240; 438/393
(58) Field of Search .................... 438/686, 239, 438/240, 393, 669, 671, 714, 723, 717, 725, 734, 715, 705

(56) References Cited

U.S. PATENT DOCUMENTS

| | | | |
|---|---|---|---|
| 5,591,301 | 1/1997 | Grewal | 156/643.1 |
| 5,817,553 | 10/1998 | Stengl et al. | 438/253 |
| 5,846,884 | 12/1998 | Naeem et al. | 438/714 |
| 5,847,423 * | 12/1998 | Yamamichi | 257/296 |
| 5,930,639 * | 7/1999 | Schuele et al. | 438/396 |

* cited by examiner

*Primary Examiner*—Gregory Mills
*Assistant Examiner*—George Goudreau
(74) *Attorney, Agent, or Firm*—Stanton C. Braden (57) ABSTRACT

A method for forming a patterned shape from a noble metal, in accordance with the present invention, includes forming a noble metal layer over a dielectric layer and patterning a hard mask layer on the noble metal layer. The hard mask layer includes a mask material that is selectively removable relative to the noble metal layer and the dielectric layer and capable of withstanding plasma etching. Alternately, the hard mask material may be consumable during the noble metal layer plasma etching. Plasma etching is performed on the noble metal layer in accordance with the patterned hard mask layer. The hard mask layer is removed such that a patterned shape formed in the noble metal layer remains intact after the plasma etching and the hard mask removal.

46 Claims, 4 Drawing Sheets

EASY TO REMOVE HARD MASK LAYER FOR SEMICONDUCTOR DEVICE FABRICATION

BACKGROUND

1. Technical Field

This disclosure relates to semiconductor fabrication and more particularly, to a hard mask and etch stop layer structure and a method for forming the hard mask and etch stop layer structure such that that the hard mask is easily removed from underlying layers during semiconductor fabrication processing.

2. Description of the Related Art

Etching of noble metals, such as platinum (Pt) is difficult due to the lack of highly volatile etch by-products at conventional processing temperatures (e.g., <100° C.). Etching of noble materials needs an appropriate etch mask or hard mask which can provide adequate resistance to harsh noble material etching processes.

The use of high wafer temperature processes, such as the temperatures developed during plasma etching, need careful selection of hard mask materials. The mask is to be made of a material that is compatible with the etch process. In addition, the mask material should not lead to stress in the underlying films and must be easy to remove after completion of electrode etch before subsequent depositions.

In dynamic random access memories (DRAM), which employ stacked capacitors, a bottom electrode of the stacked capacitors is often formed from Pt. In the prior art, a single layer oxide mask made up of TEOS oxide has been employed as a hard mask for forming the bottom electrode. Removal of this hard mask after Pt etching is difficult due to the low selectivity of TEOS oxide to other oxides which may be present including layers below the bottom electrode.

Therefore, a need exists for a hard mask layer employed for etching materials, particularly noble materials, which is capable of being easily removed after the etching process.

SUMMARY OF THE INVENTION

A method for forming a patterned shape from a noble metal, in accordance with the present invention, includes forming a noble metal layer over a substrate and patterning a hard mask layer on the noble metal layer. The hard mask layer includes a mask material that is selectively removable relative to the noble metal layer and the dielectric layer and capable of withstanding plasma etching. Alternately, the hard mask material may be consumable during the noble metal layer plasma etching. Plasma etching is performed on the noble metal layer in accordance with the patterned hard mask layer. The hard mask layer is removed such that a patterned shape formed in the noble metal layer remains in tact after the plasma etching and the hard mask removal.

Another method for forming a patterned shape from a noble metal, in accordance with the present invention includes forming a noble metal layer over a dielectric layer, and patterning a hard mask layer on the noble metal layer. The hard mask layer includes a mask material. The noble metal layer is plasma etched in accordance with the patterned hard mask layer wherein the mask material is consumed during the plasma etching such that at an end of the plasma etching a top surface of the noble metal layer remains covered by the mask material. The hard mask layer is removed selective to the noble metal layer and the dielectric layer such that a patterned shape formed in the noble metal layer and the dielectric layer remain intact after the plasma etching and the hard mask removal.

A method for forming a bottom electrode for a stacked capacitor structure of a semiconductor memory includes the steps of forming a dielectric layer on a substrate, the dielectric layer having conductive plugs formed therethrough, forming a noble metal layer on the dielectric layer in which the plug is electrically connected to the noble metal layer, patterning a hard mask layer on the noble metal layer, the hard mask layer including a mask material, plasma etching the noble metal layer in accordance with the patterned hard mask layer wherein the mask material is selectively removable relative to the noble metal layer during or after the plasma etching and removing the hard mask layer selective to the noble metal layer and the dielectric layer such that a patterned electrode is formed in the noble metal layer which remains intact after the plasma etching and the hard mask removal.

In other methods, the step of plasma etching may include performing a vertical side wall plasma etch at a target temperature of greater than about 200° C. The step of patterning the hard mask layer may include the step of providing a hard mask layer having at least two layers, and a top layer of the at least two layers may be selectively etchable relative to a lower layer of the at least two layers. One of the at least two layers may include one of boro-silicate glass, boro-phospho silicate glass and phospho silicate glass. One of the at least two layers may include silicon nitride. The hard mask layer may include at least one of boro-silicate glass, boro-phospho silicate glass, phospho silicate glass, TEOS oxide and silicon nitride. The step of forming a noble metal layer over a substrate may include the step of forming a barrier layer before forming the noble metal layer. This layer may be recessed into a plug via The step of forming a noble metal layer over a substrate may include the step of forming a barrier layer after forming the noble metal layer and etching through the barrier layer during the plasma etching. The barrier layers may include one of Ti, TiN, TiAlN, TaSiN, TaSi, TaAlN, $IrO_x$, Ir, $Al_2O_3$, AlN, and $SnO_x$.

In still other embodiments, the noble metal layer may include one of Pt, Iridium oxide, Ir, Ruthenium oxide, Pd, Os and Rh. The shape may include a bottom electrode for a stacked capacitor. The step of plasma etching may include etching the noble metal layer down to a first thickness in accordance with the patterned hard mask layer, raising a temperature of the noble metal layer and etching a remaining thickness of the noble in accordance with the patterned hard mask layer. The methods may further include the step of providing a dopant profile in the one of the at least two layers to provide a graduated etch rate therein. The methods may include the step consuming the mask material during the plasma etching such that at an end of the plasma etching a top surface of the noble metal layer remains covered by the mask material. The method may further include a second dielectric layer formed on the dielectric layer and further comprising the step of etching through the second dielectric layer during the plasma etching of the noble metal layer.

These and other objects, features and advantages of the present invention will become apparent from the following detailed description of illustrative embodiments thereof, which is to be read in connection with the accompanying drawings.

BRIEF DESCRIPTION OF DRAWINGS

This disclosure will present in detail the following description of preferred embodiments with reference to the following figures wherein.

DETAILED DESCRIPTION OF PREFERRED EMBODIMENTS

The present invention relates to semiconductor fabrication. The present invention includes alternative hard mask and etch stop layers that permit for ease of mask removal after etching and, in particular, after etching noble materials, such as Pt. The hard masks of the present invention are compatible with high wafer temperature plasma etching. The present invention will illustratively be described in terms of bottom electrode formation in stacked capacitor DRAMs. The illustrative description employing stacked capacitors should not be construed as limiting the present invention, as the invention is applicable to patterning any noble metal layer, and is useful in fabricating storage elements (e.g., in a dynamic random access memory (DRAM) or ferroelectric memory (FRAM or FeRAM) or other integrated circuit devices.

The present invention advantageously employs vertical side wall etching for etching bottom electrodes of stacked capacitors. The bottom electrodes preferable include Pt or other noble metals, such as, for example, Iridium oxide, Ir, Ruthenium oxide, Pd, Os, Rh, Ru other noble metals and/or their alloys. Vertical side wall etching includes using high wafer temperature plasma etching (>200° C.). Patterning of the Pt bottom electrode of a high-k (where k is the dielectric constant of the stacked capacitor dielectric) DRAM device includes the use of a hard mask that is compatible with high wafer temperature plasma etching. The hard mask of the present invention is also easily removable with good selectivity to a semiconductor substrate and other components in the structure. In particular, the hard mask is removable selective to the electrode material and the underlying dielectric layers used in the structure. The hard mask is removed after the completion of electrode patterning and is to be removed without destroying underlying layers below the electrode.

Figure 1:
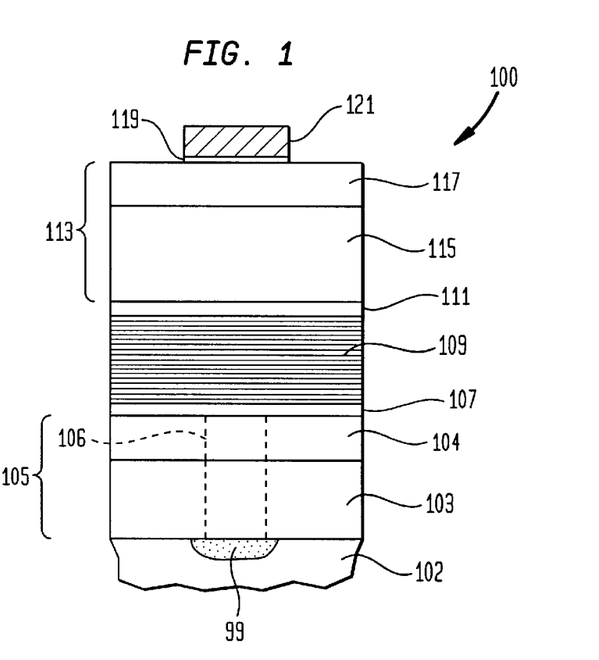
FIG. 1 is a cross-sectional view of a stack of layers employed for the formation of a stacked capacitor in accordance with the present invention.

Referring now in specific detail to the drawings in which like reference numerals identify similar or identical elements throughout the several views, and initially to FIG. 1, a semiconductor device 100 may include a semiconductor memory, such as a DRAM memory chip having stacked capacitor memory cells, or other semiconductor device. A substrate 102 preferably includes a monocrystalline silicon layer and diffusion regions 99. Substrate 102 may also include other layers such as dielectric layers, gate conductor structures or other components useful in the semiconductor industry, such as transistors, diodes isolation regions etc. A first layer 105 is formed on substrate 102. Layer 105 preferably includes a dielectric material, and more preferably an oxide, such as silicon dioxide grown in a furnace or deposited using a chemical vapor deposition (CVD), high density plasma (HDP), or plasma enhanced CVD (PECVD) process, for example, silicon dioxide deposited using TEOS (tetra-ethyl-oxo-silane), herein after referred to as TEOS oxide. Layer 105 may include multiple layers, for example, layers 103 and 104. Layer 103 is preferably TEOS oxide while layer 104 may include another dielectric material which is selectively etchable relative to layer 103 such as, for example, a nitride if an oxide is employed for layer 103, and more preferably a silicon nitride. Layer 105 is patterned to form plugs 106 (shown in phantom lines). Plugs 106 are conductive vias which connect to diffusion regions 99 in substrate 102. Diffusion regions 99 are connected to transistors to charge and discharge stacked capacitors during operations.

Figure 12:
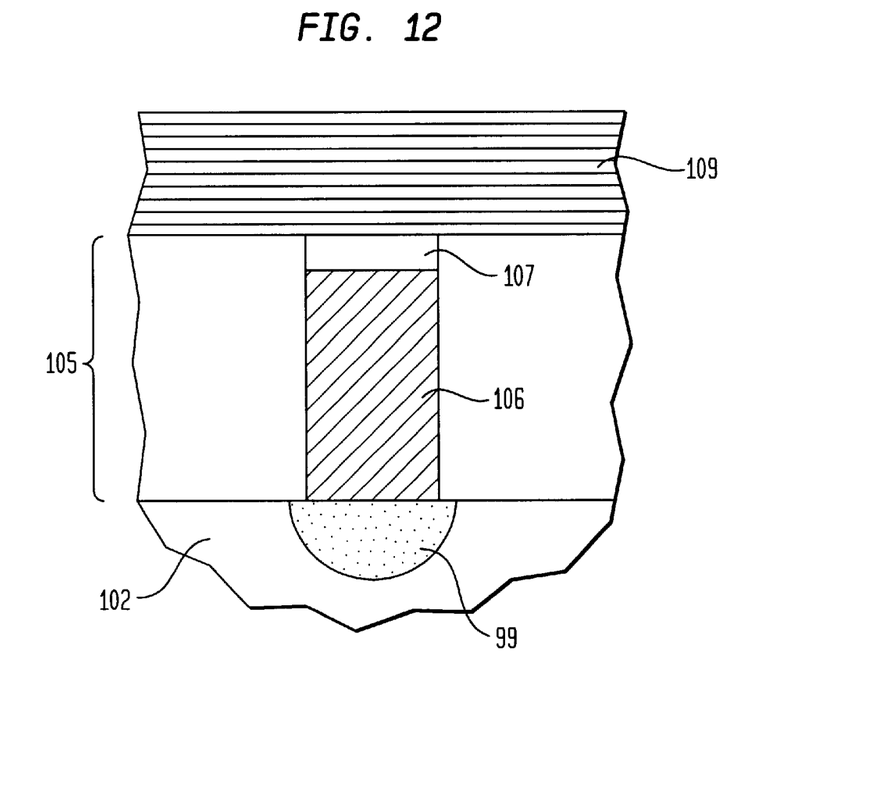
FIG. 12 is a cross-sectional view of an alternate embodiment showing a barrier layer recessed into a plug via in accordance with the present invention.

A bottom barrier layer 107 is preferably employed on layer 105. Bottom barrier layer 107 is used to prevent bottom electrode/plug 106 interaction. Layer 107 is optional and if used may include Ti, TiN, TiAlN, TaSiN, TaSi, TaAlN, IrO$_x$, Ir, Al$_2$O$_3$, AlN, SnO$_x$, etc. As will be described below, after formation of the bottom electrode a capacitor dielectric is formed, for example, Barium Strontium Titanate (BST) oxide. Oxidation of plug 106 material during this BST deposition may occur. This oxidation is prevented as a result of bottom barrier layer 107. As illustratively shown in FIG. 12, bottom barrier layer 107 may be recessed within plug 106 so that it is completely covered by electrode material 109 after etching, or bottom barrier layer 107 may not be recessed and may be a continuous film before patterning of an electrode material layer 109, as shown in FIG. 1. Bottom barrier layer 107 may be employed as an etch-stop layer underneath the bottom electrode. In this case, bottom barrier layer 107 needs to be selected to allow for a reasonable electrode overetch step and ease of mask removal after patterning of the bottom electrode.

Electrode material 109 is deposited over bottom barrier layer 107. Electrode material 109 may include Pt, Iridium oxide, Ir, Ruthenium oxide, Pd, Os, Rh, other noble metals and/or their alloys. Electrode material 109 may include multiple layers using combination of the above identified materials and their equivalents. For example, electrode material 109 may include layers such as Pt/IrO$_x$/Ir, IrO$_x$/Ir, etc. A top barrier layer 111 may be employed to prevent interaction of mask material 113 with electrode material and to serve as an etch-stop layer for a mask open step. Top barrier layer 111 is removed after etching electrode material 109. It is desirable to maintain the size and shape of this electrode after etching electrode material 109.

Top barrier layer 111 may include one or more of the following compounds/elements or their equivalents: Ti, TiN, TiAlN, TaSiN, TaSi, TaAlN, IrO$_x$, Ir, Al$_2$O$_3$, AlN, SnO$_x$, etc. A hard mask layer 113 is formed on layer 111 or directly on electrode material 109. Layer 113 preferably includes multiple layers, for example, layers 115 and 117, although a single layer (113) may be employed. One of layers 115 and 117 may include a glass layer, such as for example, borosilicate glass (BSG), boro-phospho silicate glass (BPSG), phospho silicate glass (PSG) or TEOS oxide. The BSG, BPSG or PSG layer can be graded in doping (e.g., high doping at the bottom and low doping at the top of the layer or low doping at the bottom and high doping at the top of the layer) to allow for further enhancement of mask removal. The other of layers 115 and 117 may include a material which is selectively etchable to the other of layer 115 and 117, such as, for example, a nitride material, like silicon nitride which is selectively etchable relative to oxide or glass. A resist layer 121 is formed on layer 113 to pattern layer 113 in accordance with the present invention. Resist layer 121 may be used in conjunction with an anti-reflection (ARC) layer 119 as is known in the art.

Materials selected for hard mask 113 include materials which can be selectively etched relative to electrode material 109 and underlying layers 105 (e.g., layers 103 and 104)

Figure 2:
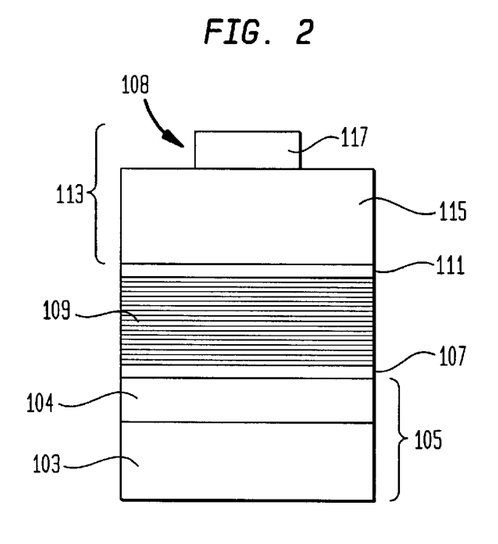
FIG. 2 is a cross-sectional view of the stack of FIG. 1 having a first layer of a hard mask patterned in accordance with the present invention.
Figure 3:
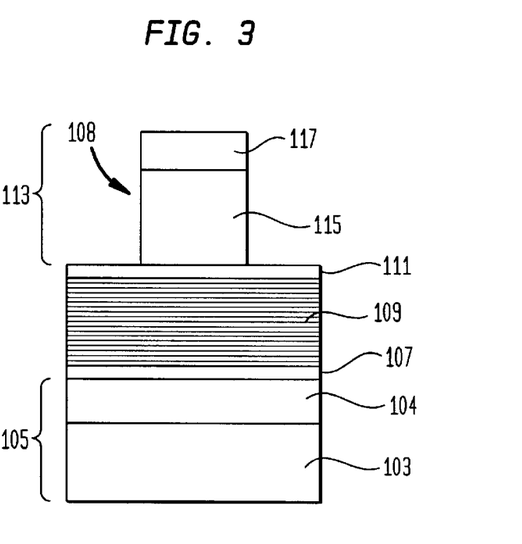
FIG. 3 is a cross-sectional view of the stack of FIGS. 1 or 2 showing a first and second layer of the hard mask patterned in accordance with the present invention.

Referring to FIGS. 2 and 3, resist layer 121 is employed to pattern layer 113, or layer 117 (FIG. 2) if multiple layers are employed for layer 113. In FIG. 2, resist layer 121 may then be stripped and layer 117 may be employed as a mask for selectively etching layer 115. This results in the structure of FIG. 3. Alternately, as shown in FIG. 3, both layers 117 and 115 (or layer 113) are patterned using resist layer 121. Patterning of layer 113 (or layers 115 and 117) preferably utilizes an anisotropic etching process, such as, for example, a reactive ion etch process or a medium to high density plasma etch process. In this way, well-defined vertical surfaces 108 are formed in hard mask layer 113.

Figure 4:
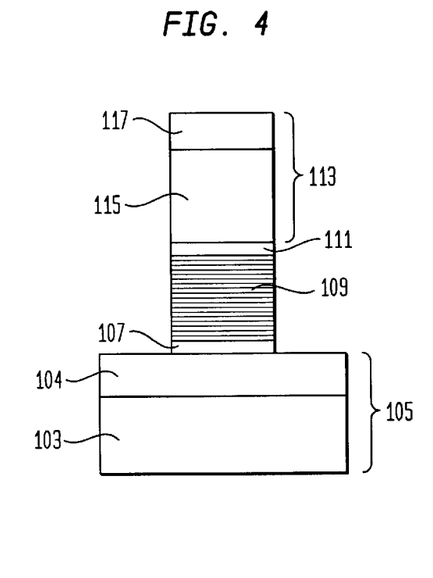
FIG. 4 is a cross-sectional view of the stack of FIGS. 2 or 3 having an electrode material and barrier layers patterned in accordance with one embodiment of the present invention.
Figure 5:
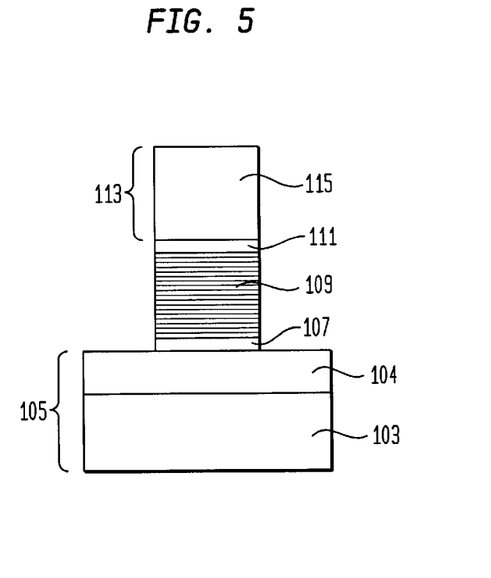
FIG. 5 is a cross-sectional view of the stack of FIG. 3 having a first layer of the hard mask removed or having a only single layer hard mask for patterning the electrode material and barrier layers in accordance with another embodiment of the present invention.

Referring to FIGS. 4 and 5, electrode material 109 is etched by employing hard mask layer 113, e.g., layers 115 and 117 (FIG. 4) or layer 115 (FIG. 5). As shown in FIG. 4, layer 117 is employed as an etch mask for electrode material 109. Layer 117 may also be employed as a mask layer to etch top barrier layer 111, if present, and etch through bottom barrier layer 107, also if present. Alternately, layer 117 is removed either during etching or prior to etching electrode material 109, as shown in FIG. 5.

The present invention preferably employs vertical side wall etching for etching electrode material 109, although other etching processes may be used. Vertical sidewall etching includes placing a wafer including device 100 on a wafer electrode in a plasma etching reactor. In one embodiment, the wafer electrode is maintained at a high temperature (e.g., >200° degrees C.). The wafer is clamped on the wafer electrode and helium backside cooling is applied to enable heat transfer to/from the wafer and wafer electrode. The wafer is exposed to a reactive plasma including halogen gases, such as chlorine, bromine or iodine (e.g., Cl$_2$, BCl$_3$, HCl, HBr, etc.) and non-reactive gases, such as Ar and N$_2$. A reactive plasma is generated by the application of radio frequency (RF) or microwave power. Additionally, RF or low frequency (LF) power is applied to the wafer electrode to direct energetic ion bombardment from the plasma onto the wafer surface to induce an etching reaction on the wafer surface.

In another embodiment, the wafer electrode is maintained at a relatively low temperature (e.g., <200° degrees C.). The wafer is clamped onto the wafer electrode and helium backside cooling is applied to enable heat transfer to/from the wafer and wafer electrode. The wafer is exposed to a reactive plasma including halogen gases, such as chlorine, bromine or iodine (e.g., Cl$_2$, BCl$_3$, HCl, HBr, etc.) and non-reactive gases, such as Ar and N$_2$. A reactive plasma is generated by the application of radio frequency (RF) or microwave power. Additionally, RF or low frequency (LF) power is applied to the wafer electrode to direct energetic ion bombardment from the plasma onto the wafer surface to induce an etching reaction on the wafer surface. During the course of the etching reaction, the helium backside pressure may be reduced, and, optionally, the wafer may be declamped. The wafer temperature rises due to plasma ion bombardment induced heating and reaches levels of greater than 200° degrees C.

In another embodiment, a multi-step etching process including a main etch step and an over etch step may be employed. In yet another embodiment, the main etching process step is continued until the complete removal of material 109 is achieved in desired areas.

Figure 11:
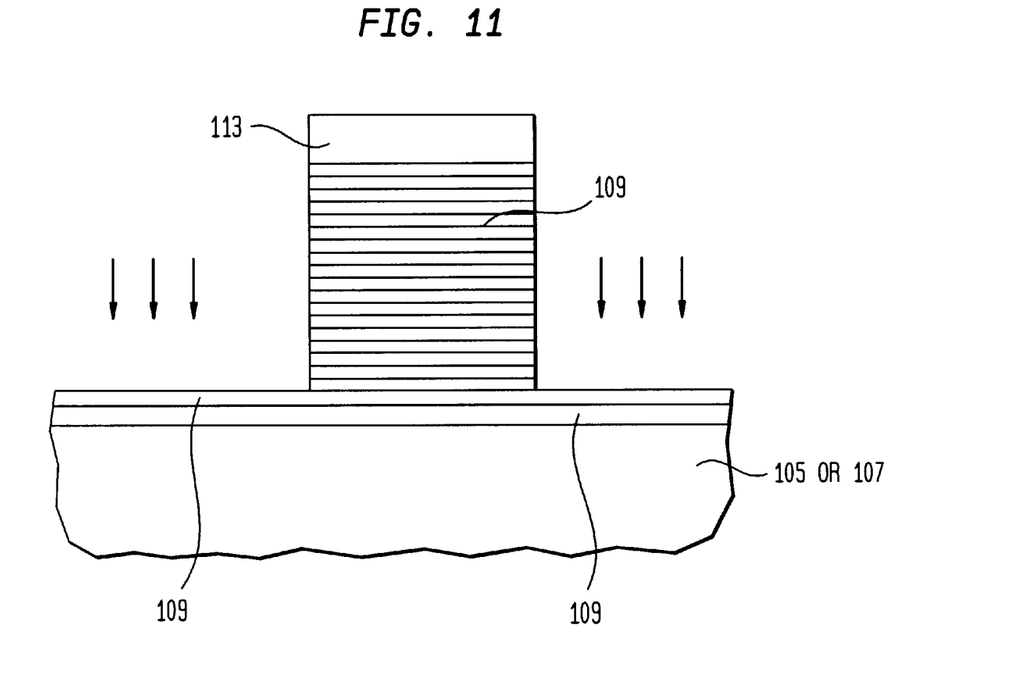
FIG. 11 is a cross-sectional view of electrode material partially etched using a first etching process at a first temperature followed by a second etch at a higher temperature in accordance with the present invention.

Referring to FIG. 11, in another embodiment, a main etching process step, in which the wafer temperature is lower, preferably between 275 C. and 350 C., is employed to partially etch electrode material 109, leaving behind, preferably between about 5% to about 20% of the initial thickness of electrode material 109 in etched areas. Then, another etching process step, employing a higher wafer temperature, preferably between 350 C. and 450 C. is used to remove the remaining thickness of electrode material 109 in the etched areas. Increasing the temperature improves selectivity for the removal of material 109 from layer 105 or layer 107.

Referring again to FIGS. 4 and 5, electrode material 109 preferably includes Iridium oxide, Ir, Ruthenium oxide, Pd, Os, Rh, other noble metals and/or their alloys which are difficult to etch using conventional techniques due to the lack of volatility of the etch products. Vertical side wall etching includes using high wafer temperature plasma etching (>200° C.). Etchants may include Cl$_2$, BCl$_3$, CCl$_4$, SiCl$_4$, HCl, HBr, CO, O$_2$, CO$_2$, CH$_4$, Ar or N$_2$ introduced at a pressure of between about 5 mTorr and about 45 mTorr. A preferred temperature range may include temperatures between about 275 to about 450 degrees C. Etchants are directed downwardly to anisotropically etch vertically into the layer to be etched. Advantageously, the present invention provides a hard mask layer compatible with this etching process and which is easily removed.

It is to be understood that the plasma etching provides better control of the size and shape of the etched noble material, e.g., electrode material 109. This provides an advantage when forming capacitor electrodes needing increased surface area in an environment where shrinking feature sizes are the trend.

Figure 6:
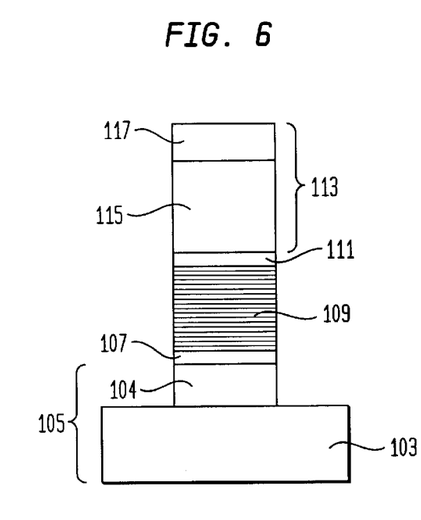
FIG. 6 is a cross-sectional view of the stack of FIG. 4 having a dielectric layer etched in accordance with the present invention.

Referring to FIG. 6, the structure of FIG. 4 is employed to further etch layer 105. Plasma etching may be employed to etch away portions of layer 105 as shown. Hard mask 113 is then removed after the electrode material etch by employing dry etching (such as plasma etching or vapor HF removal or chemical dry etching (CDE)) or wet-etching. (See, e.g., FIG. 9 for removed hard mask 113). Advantageously, hard mask 113 is removed selective to material 109 and layer 105.

Figure 7:
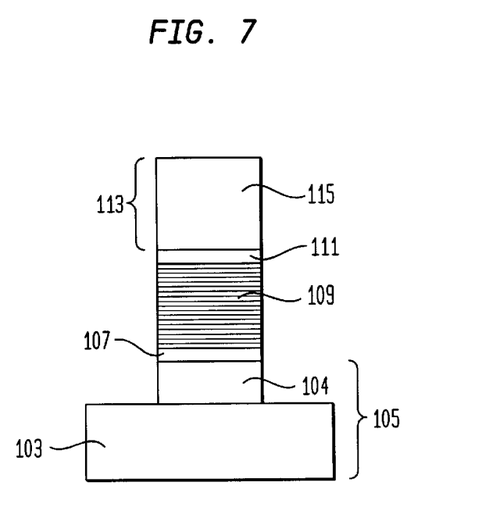
FIG. 7 is a cross-sectional view of the stack of FIG. 5 having a dielectric layer etched in accordance with the present invention.

Referring to FIG. 7, the structure of FIG. 5 is employed to further etch layer 104. Plasma etching may be employed to etch away portions of layer 105 as shown. Hard mask 113, in this case layer 117, is then removed after the electrode material etch by employing dry etching (such as plasma etching or vapor HF removal or chemical dry etching (CDE)) or wet-etching. (See, e.g., FIG. 9 for removed hard mask 113). Advantageously, hard mask 113 is removed selective to material 109 and layer 105.

Figure 8:
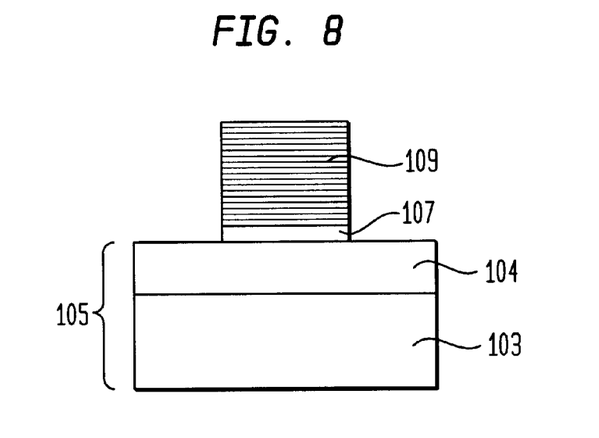
FIG. 8 is a cross-sectional view of the stack of FIGS. 2, 3, 4 or 5 having the hard mask removed during or after the electrode material is etched in accordance with the present invention.

Referring to FIG. 8, in another embodiment, the structure of FIG. 4 or 5 is employed and hard mask 113 is removed by employing dry etching (such as plasma etching, vapor HF removal or chemical dry etching (CDE)) or by wet etching. FIG. 8 shows hard mask 113 removed. Advantageously, hard mask layer 113 is removed selective to material 109 and layer 105. In still another embodiment, layer 104 is not etched during the etching of electrode material 109 and barrier layers 107 and/or 111. Hard mask 113 may be consumed during the etching of electrode material 109 and barrier layers 107 and/or 111. In a preferred embodiment, the time to etch through electrode material 109, barrier layers 107 and/or 111 is determined. A composition and/or thickness of hard mask layer 113 (layer 117 in FIGS. 4 and 6 or layer 115 in FIGS. 5 and 7) is set based on this time to etch, such that the hard mask layer 113 is substantially consumed, e.g., is just thin enough to provide coverage of barrier layer 107 (or electrode material 109). In one embodiment, the doping levels of hard mask layer 113, when glass materials are employed, are graduated to adjust etching rates or to improve selectivity.

Figure 9:
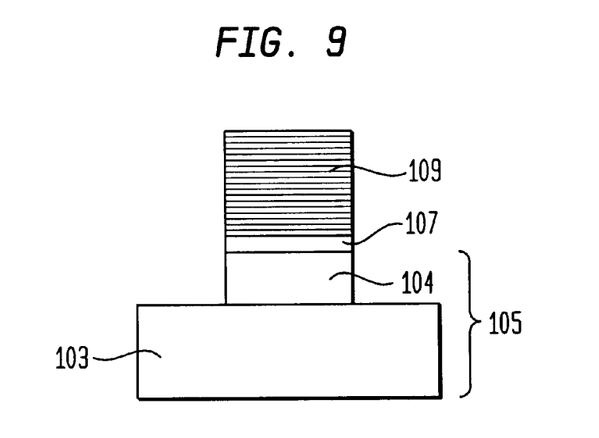
FIG. 9 is a cross-sectional view of the stack of FIGS. 2, 3, 6 or 7 having the hard mask removed during or after the electrode material is etched in accordance with the present invention.

Referring to FIG. 9, in still another embodiment, layer 104 is etched during the etching of electrode material 109 and barrier layers 107 and/or 111. Hard mask 113 may be consumed during the etching of electrode material 109 and barrier layers 107 and/or 111 and layer 104. In a preferred embodiment, the time to etch through electrode material 109, barrier layers 107 and/or 111 and layer 104 is determined. A composition and/or thickness of hard mask layer 113 (layer 117 in FIGS. 4 and 6 or layer 115 in FIGS. 5 and 7) is set based on this time to etch such that the hard mask layer 113 is substantially consumed, e.g., is just thin enough to provide coverage of barrier layer 107 (or electrode material 109). In one embodiment, the doping levels of hard mask layer 113, when glass materials are employed, may be graduated to adjust etching rates or to improve selectivity.

Figure 10:
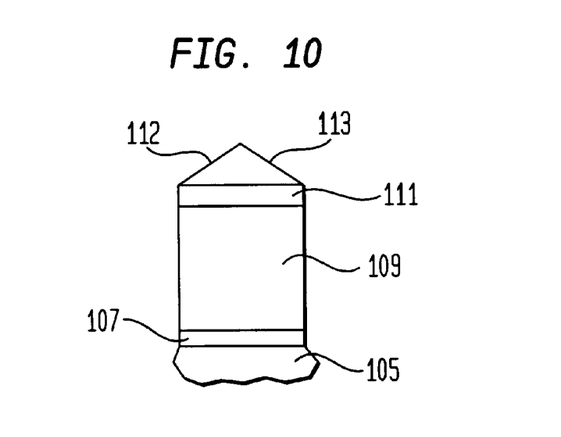
FIG. 10 is a cross-sectional view of a hard mask removed during the etching of the electrode material in accordance with the present invention.

Referring to FIG. 10, electrode material 109 and barrier layer 111 are shown having a remaining portion 112 of hard mask 113 thereon. Portion 112 remains after most of hard mask layer 113 has been consumed during etching of electrode material 109 (and barrier layers 107 and/or 111). It may be advantageous to remove as much of hard mask 113 as possible during electrode material 109 etching while leaving the electrode material 109 and underlying layers 105, etc., undamaged. This improves the capability of removing hard mask 113 while keeping the patterned electrode material 109 intact or virtually undamaged by the etching processes. Advantageously, underlying layers such as layer 105 (e.g., layers 103,104) are left virtually intact as well.

It is to be understood that not all of the layers are needed in each embodiment of the present invention. The hard mask 113 may be removed either during or after the electrode material etch. Table 1 is provided to demonstrate some illustrative embodiments of the present invention. These embodiments should not be construed as limiting the present invention and are instead set forth to demonstrate possibilities for employing the present invention.

TABLE 1

Illustrative Embodiments.

| Embodiment | Layer 117 | Layer 115 | Layer 111 | Layer 104 | Layer 103 | Process Sequence FIG. Number* |
|---|---|---|---|---|---|---|
| 1 | SiN | BSG or BPSG or PSG | **see Below | SiN | TEOS OXIDE | 1, (2), 3, 5, 7, 9 or 1, (2), 3, 5, 8 or 1, (2), 3, 4, 7, 9 or 1, (2), 3, 8, or 1, (2), 3, 9 |
| 2 | — | BSG or BPSG or PSG | **see below | SiN | TEOS OXIDE | 1, 3, 5, 7, 9 or 1, 3, 5, 8 or 1, 3, 8 or 1, 3, 9 |
| 3 | — | BSG or BPSG or PSG | **see below | — | TEOS OXIDE | 1, 3, 5, 8 or 1, 3, 8 or 1, 3, 9 |
| 4 | — | BSG or BPSG or PSG | **see below | — | TEOS OXIDE | 1, (2), 3, 5, 8 or 1, (2), 3, 4, 8 or 1, (2), 3, 8 or 1, (2), 3, 9 |
| 5 | BSG or BPSG or PSG | SiN | None or **see below | SiN | TEOS OXIDE | 1, (2), 3, 5, 9 or 1, (2), 3, 4, 7, 9 or 1, (2), 3, 4, 5, 9 or 1, (2), 3, 8 or 1, (2), 3, 9 |
| 6 | BSG or BPSG or PSG | SiN | None or **see below | — | TEOS OXIDE | 1, (2), 3, 5, 8 or 1, (2), 3, 4, 8 or 1, (2), 3, 8 or 1, (2), 3, 8 or 1, (2), 3, 9 |

*A parenthesis indicates an optional step.
**Layer 111 is optional and if used may Ti, TiN, TiAlN, TaSiN, TaSi, TaAlN, $IrO_x$, Ir, $Al_2O_3$, AlN, $SnO_x$, etc.

The present invention provides many advantages over the prior art, particularly in forming shapes or electrodes from noble metals for stacked capacitors in DRAM chips. Some of the advantages of the present invention include:

(1) Easy mask removal during or after noble metal electrode etching;
(2) Mask materials are compatible with high temperature electrode etching;
(3) The methods of the present invention support integration into conventional processing sequences.

After electrode material 109 is patterned, barrier layer 111 is preferably removed and a high dielectric constant material (BST or BSTO) is formed over electrode material 109 to form a capacitor dielectric (not shown), followed by a deposition of a top electrode to form a stacked capacitor.

Having described preferred embodiments for an easy to remove hard mask layer for semiconductor device fabrication (which are intended to be illustrative and not limiting), it is noted that modifications and variations can be made by persons skilled in the art in light of the above teachings. It is therefore to be understood that changes may be made in the particular embodiments of the invention disclosed which are within the scope and spirit of the invention as outlined by the appended claims. Having thus described the invention with the details and particularity required by the patent laws, what is claimed and desired protected by Letters Patent is set forth in the appended claims.

What is claimed is:

1. A method for forming a patterned shape from a noble metal comprising the steps of:
    forming a noble metal layer over a dielectric layer;
    patterning a hard mask layer on the noble metal layer, the hard mask layer including a mask material which is selectively removable relative to the noble metal layer and the dielectric layer and capable of withstanding plasma etching by providing a hard mask layer having at least two layers, a top layer of the at least two layers being selectively etchable relative to a lower layer of the at least two layers;
    plasma etching the noble metal layer in accordance with the patterned hard mask layer; and
    removing the hard mask layer selective to the noble metal layer and the dielectric layer such that a patterned shape formed in the noble metal layer remains intact after the plasma etching and the hard mask removal.

2. The method as recited in claim 1, wherein the step of plasma etching includes performing a vertical side wall plasma etch at a target temperature of greater than about 200° C.

3. The method as recited in claim 1, wherein one of the at least two layers includes one of boro-silicate glass, boro-phospho silicate glass and phospho silicate glass.

4. The method as recited in claim 1, wherein one of the at least two layers includes silicon nitride.

5. The method as recited in claim 1, wherein the hard mask layer includes at least one of boro-silicate glass, boro-phospho silicate glass, phospho silicate glass, TEOS oxide and silicon nitride.

6. The method as recited in claim 1, wherein the step of forming a noble metal layer over a substrate includes the step of forming a barrier layer before forming the noble metal layer.

7. The method as recited in claim 7, wherein the barrier layer includes one of Ti, TiN, TiAlN, TaSiN, TaSi, TaAlN, $IrO_x$, Ir, $Al_2O_3$, AlN, and $SnO_x$.

8. The method as recited in claim 1, wherein the step of forming a noble metal layer over a substrate includes the step of forming a barrier layer after forming the noble metal layer and etching through the barrier layer during the plasma etching.

9. The method as recited in claim 8, wherein the barrier layer includes one of Ti, TiN, TiAlN, TaSiN, TaSi, TaAlN, $IrO_x$, Ir, $Al_2O_3$, AlN, and $SnO_x$.

10. The method as recited in claim 1, wherein the noble metal layer includes one of Pt, Iridium oxide, Ir, Ruthenium oxide, Pd, Os and Rh.

11. The method as recited in claim 1, wherein the shape includes a bottom electrode for a stacked capacitor.

12. The method as recited in claim 1, wherein the step of plasma etching includes:
    etching the noble metal layer down to a first thickness in accordance with the patterned hard mask layer;
    raising a temperature of the noble metal layer; and
    etching a remaining thickness of the noble in accordance with the patterned hard mask layer.

13. The method as recited in claim 1, further comprising a second dielectric layer formed on the dielectric layer and further comprising the step of etching through the second dielectric layer during the plasma etching of the noble metal layer.

14. A method for forming a patterned shape from a noble metal comprising the steps of:
    forming a noble metal layer over a dielectric layer;
    patterning a hard mask layer on the noble metal layer, the hard mask layer including a mask material;
    providing a dopant profile in hard mask layer to provide a graduated etch rate therein;
    plasma etching the noble metal layer in accordance with the patterned hard mask layer wherein the mask material is consumed during the plasma etching such that at an end of the plasma etching a top surface of the noble metal layer remains covered by the mask material; and
    removing the hard mask layer selective to the noble metal layer and the dielectric layer such that a patterned shape formed in the noble metal layer remains intact after the plasma etching and the hard mask removal.

15. The method as recited in claim 14, wherein the step of plasma etching includes performing a vertical side wall plasma etch at a target temperature of greater than about 200° C.

16. The method as recited in claim 14, wherein the step of patterning the hard mask layer includes the step of providing a hard mask layer having at least two layers, a top layer of the at least two layers being selectively etchable relative to a lower layer of the at least two layers.

17. The method as recited in claim 16, wherein one of the at least two layers includes one of boro-silicate glass, boro-phosphorous silicate glass and phosphorous silicate glass.

18. The method as recited in claim 16, wherein one of the at least two layers includes silicon nitride.

19. The method as recited in claim 14, wherein the hard mask layer includes at least one of boro-silicate glass, boro-phospho silicate glass, phospho silicate glass, TEOS oxide and silicon nitride.

20. The method as recited in claim 14, wherein the step of forming a noble metal layer over a substrate includes the step of forming a barrier layer before forming the noble metal layer.

21. The method as recited in claim 20, wherein the barrier layer includes one of Ti, TiN, TiAlN, TaSiN, TaSi, TaAlN, $IrO_x$, Ir, $Al_2O_3$, AlN, and $SnO_x$.

22. The method as recited in claim 14, wherein the step of forming a noble metal layer over a substrate includes the step of forming a barrier layer after forming the noble metal layer and etching through the barrier layer during the plasma etching.

23. The method as recited in claim 22, wherein the barrier layer includes one of Ti, TiN, TiAlN, TaSiN, TaSi, TaAlN, $IrO_x$, Ir, $Al_2O_3$, AlN, and $SnO_x$.

24. The method as recited in claim 14, wherein the noble metal layer includes one of Pt, Iridium oxide, Ir, Ruthenium oxide, Pd, Os and Rh.

25. The method as recited in claim 14, wherein the shape includes a bottom electrode for a stacked capacitor.

26. The method as recited in claim 14, wherein the step of plasma etching includes:
   etching the noble metal layer down to a first thickness in accordance with the patterned hard mask layer;
   raising a temperature of the noble metal layer; and
   etching a remaining thickness of the noble in accordance with the patterned hard mask layer.

27. The method as recited in claim 14, further comprising a second dielectric layer formed on the dielectric layer and further comprising the step of etching through the second dielectric layer during the plasma etching of the noble metal layer.

28. A method for forming a bottom electrode for a stacked capacitor structure of a semiconductor memory comprising the steps of:
   forming a dielectric layer on a substrate, the dielectric layer having conductive plugs formed therethrough;
   forming a noble metal layer on the dielectric layer in which the plug is electrically connected to the noble metal layer;
   patterning a hard mask layer on the noble metal layer, the hard mask layer including a mask material having at least two layers, a top layer of the at least two layers being selectively etchable relative to a lower layer of the at least two layers;
   plasma etching the noble metal layer in accordance with the patterned hard mask layer wherein the mask material is selectively removable relative to the noble metal layer during or after the plasma etching; and
   removing the hard mask layer selective to the noble metal layer and the dielectric layer such that a patterned electrode is formed in the noble metal layer which remains intact after the plasma etching and the hard mask removal.

29. The method as recited in claim 28, wherein the step of removing the hard mask layer includes the step of consuming the mask material during the plasma etching such that at an end of the plasma etching a top surface of the noble metal layer remains covered by the mask material.

30. The method as recited in claim 28, wherein the hard mask layer is capable of withstanding plasma etching and further comprising the step of selectively removing the hard mask layer relative to the noble metal layer after the plasma etching.

31. The method as recited in claim 28, wherein the step of plasma etching includes performing a vertical side wall plasma etch at a target temperature of greater than about 200° C.

32. The method as recited in claim 28, wherein one of the at least two layers includes one of boro-silicate glass, boro-phospho silicate glass and phospho silicate glass.

33. The method as recited in claim 28, wherein one of the at least two layers includes silicon nitride.

34. The method as recited in claim 28, further comprising the step of providing a dopant profile in the one of the at least two layers to provide a graduated etch rate therein.

35. The method as recited in claim 28, wherein the hard mask layer includes at least one of boro-silicate glass, boro-phospho silicate glass, phospho silicate glass, TEOS oxide and silicon nitride.

36. The method as recited in claim 35, further comprising the step of providing a dopant profile in hard mask layer to provide a graduated etch rate therein.

37. The method as recited in claim 28, wherein the step of forming a noble metal layer includes the step of forming a barrier layer before forming the noble metal layer.

38. The method as recited in claim 28, wherein the barrier layer includes one of Ti, TiN, TiAlN, TaSiN, TaSi, TaAlN, $IrO_x$, Ir, $Al_2O_3$, AlN, and $SnO_x$.

39. The method as recited in claim 28, wherein the step of forming a noble metal layer includes the step of forming a barrier layer after forming the noble metal layer and etching through the barrier layer during the plasma etching.

40. The method as recited in claim 39, wherein the barrier layer includes one of Ti, TiN, TiAlN, TaSiN, TaSi, TaAlN, $IrO_x$, Ir, $Al_2O_3$, AlN, and $SnO_x$.

41. The method as recited in claim 28, wherein the noble metal layer includes one of Pt, Iridium oxide, Ir, Ruthenium oxide, Pd, Os and Rh.

42. The method as recited in claim 28, wherein the dielectric layer includes at least one of TEOS oxide and silicon nitride.

43. The method as recited in claim 28, wherein the step of plasma etching includes:
   etching the noble metal layer down to a first thickness in accordance with the patterned hard mask layer;
   raising a temperature of the noble metal layer; and
   etching a remaining thickness of the noble in accordance with the patterned hard mask layer.

44. The method as recited in claim 28, further comprising a second dielectric layer formed on the dielectric layer and further comprising the step of etching through the second dielectric layer during the plasma etching of the noble metal layer.

45. A method for forming a patterned shape from a noble metal comprising the steps of:
   forming a noble metal layer over a dielectric layer;
   patterning a hard mask layer on the noble metal layer, the hard mask layer including a mask material which is selectively removable relative to the noble metal layer and the dielectric layer and capable of withstanding plasma;
   plasma etching the noble metal layer in accordance with the patterned hard mask layer by:
      etching the noble metal layer down to a first thickness in accordance with the patterned hard mask layer;
      raising a temperature of the noble metal layer; and
      etching a remaining thickness of the noble in accordance with the patterned hard mask layer; and
   removing the hard mask layer selective to the noble metal layer and the dielectric layer such that a patterned shape formed in the noble metal layer remains intact after the plasma etching and the hard mask removal.

46. A method for forming a patterned shape from a noble metal comprising the steps of:
   forming a noble metal layer over a first dielectric layer; the first dielectric layer having a second dielectric layer formed thereon;
   patterning a hard mask layer on the noble metal layer, the hard mask layer including a mask material which is selectively removable relative to the noble metal layer and the dielectric layer and capable of withstanding plasma etching;
   plasma etching the noble metal layer in accordance with the patterned hard mask layer;
   etching through the second dielectric layer during the plasma etching of the noble metal layer; and
   removing the hard mask layer selective to the noble metal layer and the first dielectric layer such that a patterned shape formed in the noble metal layer remains intact after the plasma etching and the hard mask removal.

* * * * *